United States Patent
Deptula et al.

(10) Patent No.: US 7,525,221 B2
(45) Date of Patent: Apr. 28, 2009

(54) CONNECTION ARRANGEMENT FOR CONNECTING AN ELECTRONIC COMPONENT AND A POWER CIRCUIT OF A CONTROL DEVICE

(75) Inventors: Piotr Deptula, Illingen (DE); Werner Birkle, Ludwigsburg (DE); Joachim Schenk, Meinersen-Ohof (DE); Jochen Wessner, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/473,742

(22) PCT Filed: Nov. 29, 2002

(86) PCT No.: PCT/DE02/04383

§ 371 (c)(1),
(2), (4) Date: Apr. 1, 2004

(87) PCT Pub. No.: WO03/065777

PCT Pub. Date: Aug. 7, 2003

(65) Prior Publication Data

US 2004/0150931 A1 Aug. 5, 2004

(30) Foreign Application Priority Data

Feb. 1, 2002 (DE) .............................. 102 04 355

(51) Int. Cl.
*B23K 11/24* (2006.01)
*H01R 12/00* (2006.01)
*H01R 13/40* (2006.01)
*H05K 1/00* (2006.01)

(52) U.S. Cl. .................. 307/112; 439/56; 439/736
(58) Field of Classification Search ............. 439/736, 439/56; 307/10.1, 112
See application file for complete search history.

(56) References Cited

U.S. PATENT DOCUMENTS

| 2,613,252 A | 10/1952 | Heibel |
| 3,978,375 A | 8/1976 | Fukui et al. |
| 4,318,158 A * | 3/1982 | Livermore et al. ............ 362/29 |

(Continued)

FOREIGN PATENT DOCUMENTS

DE 2418954 10/1974

(Continued)

OTHER PUBLICATIONS

Dirmeyer et al. WO 9607302 A1, Mar. 7, 1996, whole document.*

*Primary Examiner*—Albert W Paladini
*Assistant Examiner*—Michael Rutland Wallis
(74) *Attorney, Agent, or Firm*—Kenyon & Kenyon LLP

(57) ABSTRACT

To reduce the space of a control device having a power circuit and an electronic component, the power circuit including components to which higher currents are applied, in particular currents in the range of 5 A to 70 A, and the electronic component including a switching logic realized on a circuit board, the electrical connections between the components of the power circuit are realized by a single-layer pressed screen. Receptacles for the contact pins of the components are formed in the pressed screen. The receptacles are arranged and formed in such a way that the components are held in frictional engagement in the receptacles and are electrically contacted via the contact pins.

16 Claims, 2 Drawing Sheets

U.S. PATENT DOCUMENTS

| | | | |
|---|---|---|---|
| 4,968,271 A | | 11/1990 | Buscella |
| 5,040,996 A | * | 8/1991 | Kobold et al. ............... 439/76.2 |
| 5,357,142 A | * | 10/1994 | Kubota et al. ............... 307/10.1 |
| 5,446,626 A | | 8/1995 | Kruger et al. |
| 5,581,130 A | * | 12/1996 | Boucheron ................. 307/10.1 |
| 5,762,257 A | * | 6/1998 | Garrecht .................... 228/56.2 |
| 5,857,877 A | * | 1/1999 | Hotea et al. ................. 439/787 |
| 6,049,043 A | * | 4/2000 | Tonejc ........................ 174/250 |
| 6,068,491 A | * | 5/2000 | Hofmeister et al. ........... 439/34 |
| 6,739,916 B2 | | 5/2004 | Geil et al. |
| 6,755,698 B2 | * | 6/2004 | Kaiser et al. ................ 439/874 |

FOREIGN PATENT DOCUMENTS

| | | | |
|---|---|---|---|
| DE | 3934790 | | 5/1990 |
| DE | 19514078 | | 10/1995 |
| DE | 19539584 | | 4/1997 |
| DE | 197 14 755 | * | 10/1997 |
| DE | 19832560 | | 1/1999 |
| DE | 19953191 | | 5/2001 |
| EP | 0 722 264 | | 7/1996 |
| FR | 2806217 | | 9/2001 |
| JP | 59148514 | | 8/1984 |
| JP | 6085430 | | 3/1994 |
| JP | 6155055 | | 6/1994 |
| JP | 9200926 | | 7/1997 |
| WO | WO 01/33926 A2 | * | 5/2001 |

* cited by examiner

CONNECTION ARRANGEMENT FOR CONNECTING AN ELECTRONIC COMPONENT AND A POWER CIRCUIT OF A CONTROL DEVICE

FIELD OF THE INVENTION

The present invention relates to a control device having a power circuit and an electronic component, the power circuit including components to which higher currents are applied, in particular currents in the range of 5 A to 70 A, and the electronic component including a switching logic realized on a circuit board.

BACKGROUND INFORMATION

Control devices for vehicle electrical systems are usually control devices of the type listed above. The power circuit includes all the components to which higher currents are applied, i.e., currents between 5 A and 70 A, such as relays and fuses of the window heater, the horn, etc. The connections between the components of the power circuit must be configured for these high currents. In practice, stamped strips fabricated from a multi-layer pressed screen have successfully been used as connection paths of the power circuit. At least for some of the components, such as the relays, additional contacting elements are provided, for example in the form of contacts soldered or welded onto the pressed screen. The pins of the external power-circuit connectors are often designed as individual pins. The space and material requirements of this variant are relatively high, which results in relatively high production and assembly costs. The electronic component includes the switching logic for the power circuit. The current load in this case is normally in the range of up to 2 A. The switching logic and also the associated connections are usually realized in the form of a circuit board having etched path structures. The electrical connection between the power circuit and the electronic component is generally realized via a soldered connection between corresponding contact points of the two units. On the one hand, control signals that switch the relays, for example, are transmitted from the switching logic to the power circuit via this soldered connection and, on the other hand, feedback signals from the power circuit, for instance from the relays, are transmitted back to the circuit board, i.e., the switching logic.

SUMMARY

In accordance with an example embodiment of the present invention, a control device is provided which has a modular design in that the power circuit and the electronic component are structurally separate from one another. The design of the example embodiment of the present invention also allows a marked reduction in the space required for the power circuit; it also requires less material, and reduces the production and assembly effort. As a consequence, the example control device of the present invention may be realized in a relatively small size, at relatively low weight, and also relatively low expense.

In an example embodiment of the present invention, this may be achieved in that the electrical connections between the components of the power circuit are realized by a single-layer pressed screen. Formed in the pressed screen are receptacles for the contact pins of the components, namely in such a way that the components are held in frictional engagement in the receptacles via the contact pins and are electrically contacted.

The present invention is based on the recognition that higher currents, as they occur in the power circuit of a control device of the type in question, may also be conducted via stamping strips of a single-layer pressed screen. According to an example embodiment of the present invention, it is therefore proposed to form all electrical connections between the components of the power circuit in a single-layer pressed screen, using an appropriate layout. Furthermore, it is possible, by an expedient use of pressed-screen technology, to realize a high functionality even in a single-layer pressed screen. Therefore, in accordance with the present invention, in addition to the electrical connections, receptacles for the contact pins of the components may be formed in the single-layer pressed screen as well. The contact pins of the components are directly inserted in these receptacles of the pressed screen, without additional contacting elements, and held there in frictional engagement and are electrically contacted. In this way, all inputs and outputs of the components of the power circuit may be realized on the side of the pressed screen. This means that the pressed screen is not only used here to establish electrical connections between the components of the power circuit, but is utilized as a carrier for the electrical components as well. By using a single-layer pressed screen according to the present invention to realize the electrical connections between the components and by dispensing with additional contacting elements for the components, the space required for the power circuit is substantially reduced, as is the necessary material and, consequently, the weight of the entire control device, too.

Basically, there are various possibilities for realizing the control device of the present invention and, in particular, for realizing the pressed screen with the receptacles for the contact pins of the power-circuit components.

In view of a simple assembly of the power circuit and, in particular, an uncomplicated exchange of defective components, it may be advantageous if the connection between the contact pins of a component and the corresponding receptacles in the pressed screen is made to be reversible and releasable again. In an advantageous variant of the present invention that satisfies this requirement, the receptacles for the contact pins are realized in the form of stamping holes in the pressed screen. Formed in the edge region of such a stamped hole are at least two, preferably three, inwardly directed retaining lips, specifically in such a way that the retaining lips exert a clamping effect on a contact pin inserted into the stamped hole. The clamping effect may be advantageously enhanced in that the retaining lips are deformed upon insertion of the contact pin. It may be particularly advantageous if the retaining lips are elastically deformable, since the components of the power circuit may then be exchanged in a simple manner, without problems having to be anticipated in the electrical contacting via the pressed screen. The afore-described variants of a receptacle for a contact pin are advantageous also because they are easily realizable in pressed-screen technology.

In an advantageous further development of the present invention for realizing the power circuit of a control device, the functionality of the single-layer pressed screen may additionally be enhanced in that contacting elements for the circuit board of the electronic component are also formed in the pressed screen. In this case, the electrical contacting between the power circuit and the electronic component may be realized simply by partial soldering of the contacting elements formed in the pressed screen to corresponding contacting points of the circuit board. There are no additional auxiliary constructions required for this purpose. In this variant, the transmission of the control signals from the switching logic to the components of the power circuit is also carried out via the pressed screen, namely via the contacting elements for the circuit board of the electronic component, just as their feedback data is transmitted back to the switching logic via the contacting elements formed in the pressed screen.

Alternatively, or in addition to, the afore-described variant, the functionality of the single-layer pressed screen may also be enhanced by forming connector pins for at least one external power-circuit connector. In this case, the external consumers connected to the power circuit are likewise controlled in the high-current range via the pressed screen, namely the connector pins of the external power-circuit connectors formed in the pressed screen.

BRIEF DESCRIPTION OF THE DRAWING

There are various possibilities for advantageously embodying and further refining the present invention.

DETAILED DESCRIPTION OF EXAMPLE EMBODIMENT

Figure 1:
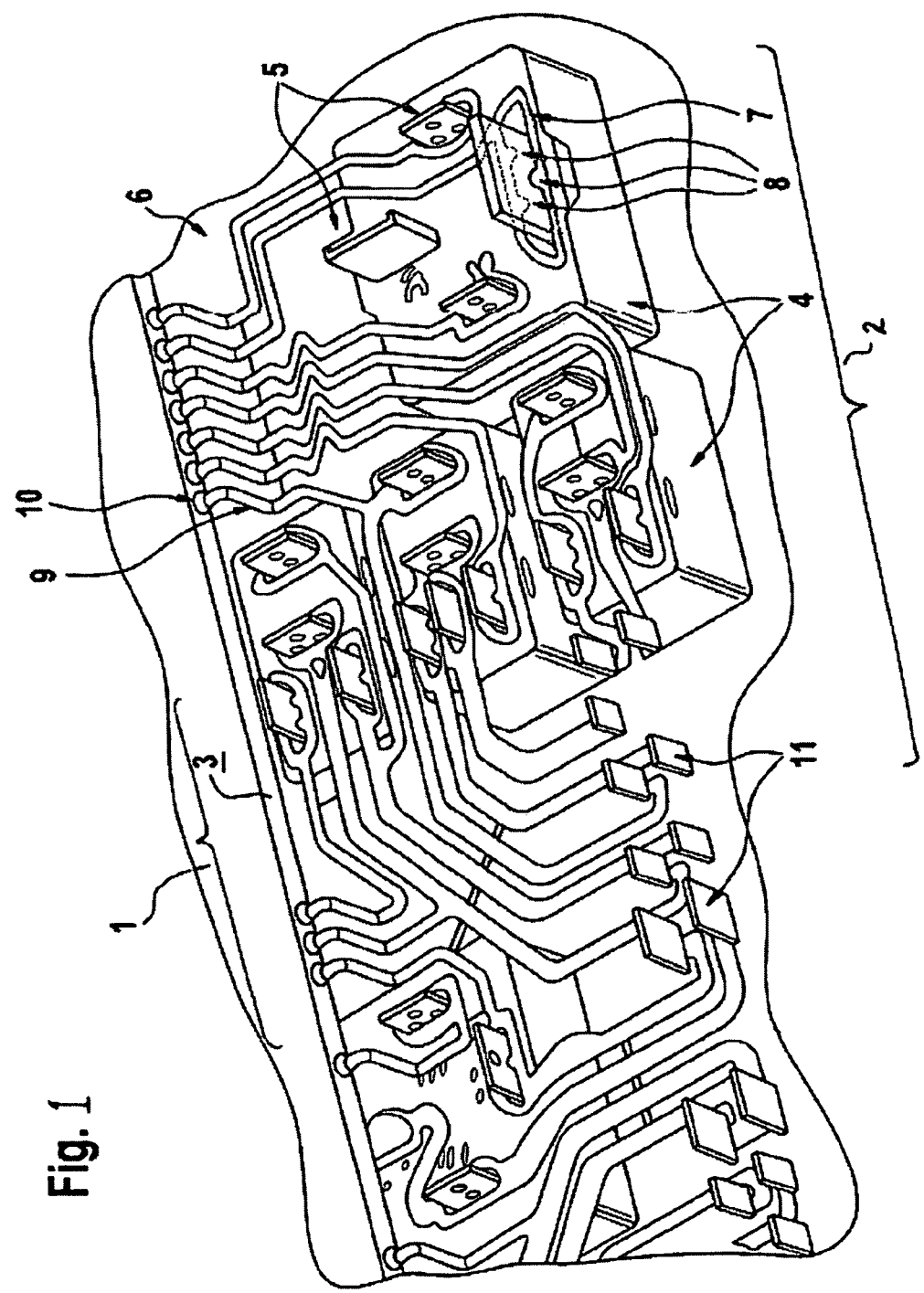
FIG. 1 shows a perspective partial representation of the power circuit and the electronic component of a control device according to an example embodiment of the present invention.

The control device shown in FIG. 1 in a cutaway view is the control device of a vehicle electrical system. It includes two main units, electronic component 1 and power circuit 2.

Electronic component 1 includes the switching logic for power circuit 2. The current load here is in the range of up to 2 A. The entire switching logic is realized on a circuit board 3, the respective connections being formed by etched path structures.

Figure 2:
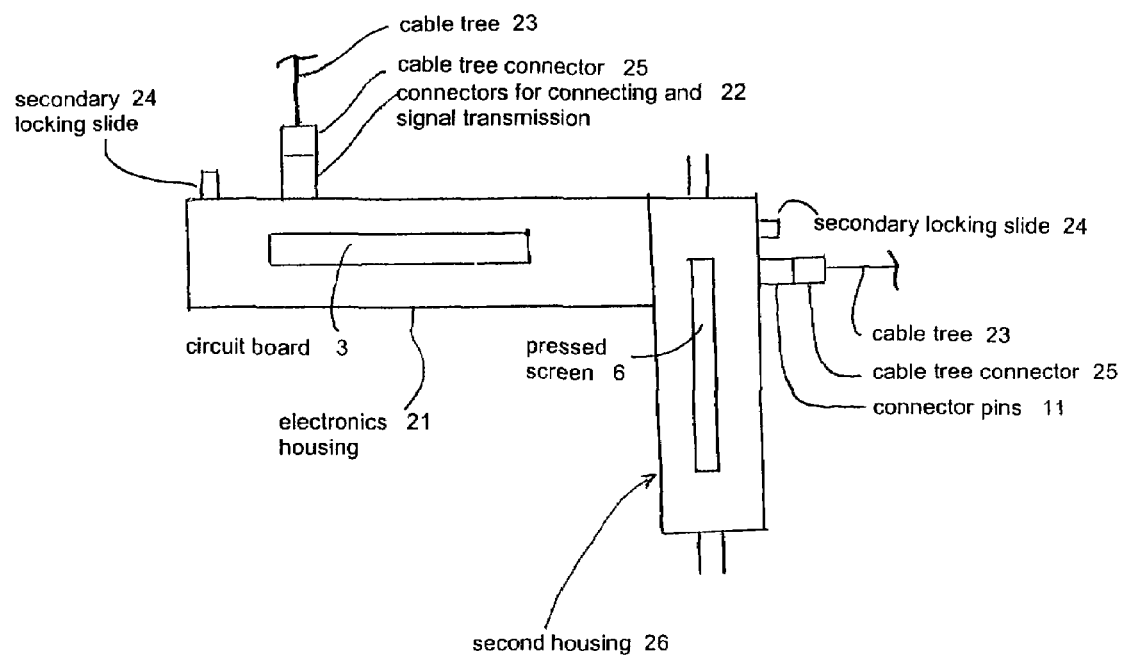
FIG. 2 shows a schematic illustration of the electronic housing containing the circuit board, and a second housing containing the pressed screen.

Circuit board 3 is arranged in an electronics housing 21, which is not shown in FIG. 2. Circuit board 3 is positioned in the electronics housing via centering pins and held at the sides of circuit board 3 by means of detent hooks. Arranged on the outside of the electronics housing are connectors 22 that are used for contacting and signal transmission toward the external cable tree 23. Via a secondary locking slide 24, the cable-tree connector 25 may additionally be held in locking position and be queried for position accuracy.

Power circuit 2 unites all components 4 to which higher currents are applied, i.e., currents I having a magnitude of 5 A<I<70 A. These are, for example, relays and fuses for the window heater or the horn.

According to the example embodiment of the present invention, the electrical connections between components 4 of power circuit 2 are realized by a single-layer pressed screen 6. Also formed in pressed screen 6 are receptacles 7 for contact pins 5 of components 4. Components 4 are held in receptacles 7 in frictional engagement and electrically contacted via their contact pins 5.

In the example embodiment shown here, receptacles 7 for contact pins 5 of components 4 are realized in the form of stamped holes in pressed screen 6. The stamped holes have a generally semicircular basic form. Three inwardly directed retaining lips 8 are formed in the edge region of each stamped hole. Two of retaining lips 8 are arranged at the curved inner edge of the stamped hole, whereas third retaining lip 8 is arranged in the center between these two retaining lips 8, at the oppositely lying straight inner edge of the stamped hole. Retaining lips 8 are elastically deformable. When a contact pin 5 is plugged in, they are pressed out of the plane of pressed screen 6. In the process, they exert a clamping action on contact pin 5, which ensures a reliable, frictionally engaged affixation and a reliable electrical contacting of component 4 via pressed screen 6. Due to the elastic deformability of retaining lips 8, components 4 may also be exchanged at any time without any problems.

In the example embodiment shown, the electrical interface between power circuit 2 and electronic component 1 is likewise realized with the aid of pressed screen 6. For this purpose, contacting elements 9 for circuit board 3 of electronic component 1 are formed in pressed screen 6. Contacting elements 9 are pins that are bent out of the plane of pressed screen 6 and soldered to corresponding contacting points 10 of circuit board 3. Furthermore, connector pins 11 for the external power-circuit connectors are formed out from pressed screen 6.

As in the case of circuit board 3 of electronic component 1, pressed screen 6 with components 4 of power circuit 2 is also arranged in a second housing 26 that is shown in FIG. 2. The second housing, or the power-circuit housing, is made up of a base plate and a cover, which may be clipped to each other, so that components 4 of the power circuit are easily accessible. Pressed screen 6 with components 4 is inserted between the two housing components and held there by form locking, the demands on tolerance compensation being taken into account.

Connector pins 11 for the external power-circuit connectors project from the base plate of the power-circuit housing and, together with the plastic receptacles realized on the outside of the base plate, form the device-connector collar.

Here, too, analogously to electronic component 1, a locking slide may be provided to query the cable tree connector position.

In summary, it can be said that the example control device of the present invention supports a modular design that has a clear separation between electronic component and power circuit. The space required for the power circuit can be reduced to a minimum as a result of the measures according to the present invention, which results in substantial savings in material compared to conventional control device realizations. This lowers the manufacturing and assembly costs as well.

The main component of the concept according to the present invention is a single-layer stamped screen, which has a plurality of functions within the framework of the power circuit. For instance, the stamped screen, as is also the case in conventional design technology, is used to realize the electrical connections of the components of the power circuit. At the same time, however, the stamped screen also constitutes the carrier for these components. In contrast to conventional design technology, no additional auxiliary elements are utilized. Furthermore, the electrical contacting between the power circuit and the electronic component may also be realized with the aid of the pressed screen. It is also possible to form all connector pins of the external power-circuit connectors in the pressed screen. Within the framework of the concept of the present invention, the pressed screen thus takes on an integrating function between the power circuit and the electronic component, the components, such as relays, and the external control via the power-circuit connector.

What is claimed is:
1. A control device, comprising:
a power circuit;
an electronic component including a switching logic for the power circuit included on a circuit board, wherein the circuit board is provided in a first housing, the first housing being an electronics housing; and a connector provided on the outside of the first housing, wherein the connector is configured to provide connection and signal transmission;

wherein electrical connections between components of the power circuit are provided by a single-layer pressed screen, receptacles for contact pins of the components of the power circuit are formed in the pressed screen and the receptacles are arranged and configured so that the components of the power circuit are held in frictional engagement in the receptacles via the contact pins and are electrically contacted to one another, wherein the single-layer pressed screen is provided in a second housing including a base plate and a cover, and wherein the single-layer pressed screen is inserted between the base plate and the cover of the second housing and held in position by form locking;

wherein the receptacles for the contact pins are in a form of stamped holes in the pressed screen, wherein each stamped hole has an essentially semicircular basic form, wherein each stamped hole has an edge region with three inwardly directed retaining lips, wherein the first two inwardly directed retaining lips are arranged at one inner edge of the stamped hole, and wherein the third inwardly directed retaining lip is arranged at an oppositely lying inner edge of the stamped hole.

2. The control device as recited in claim 1, wherein currents in a range of 5 A to 70 A are applied to the components of the power circuit.

3. The control device as recited in claim 1, wherein an electrical connection between the contact pins of one of the components and corresponding receptacles in the pressed screen is implemented so as to be reversible and releasable.

4. The control device as recited in claim 1, wherein the first two inwardly directed retaining lips are arranged at a curved inner edge of the stamped hole, and wherein the third inwardly directed retaining lip is arranged in the center between the first two retaining lips, at an oppositely lying straight inner edge of the stamped hole.

5. The control device as recited in claim 4, wherein the retaining lips are deformable.

6. The control device as recited in claim 5, wherein the retaining lips are elastically deformable.

7. The control device as recited in claim 1, wherein contacting elements for the circuit board of the electronic component are formed in the pressed screen.

8. The control device as recited in claim 7, wherein electrical contacting between the power circuit and the electronic component is realized by soldering of a portion of each of the contacting elements formed in the pressed screen to corresponding contacting points of the circuit board.

9. The control device as recited in claim 1, wherein connector pins for at least one external power-circuit connector are formed in the pressed screen.

10. A control device for a vehicle electrical system of a motor vehicle, comprising:
a power circuit;
an electronic component including a switching logic for the power circuit included on a circuit board, wherein the circuit board is provided in a first housing, the first housing being an electronics housing; and
a connector provided on the outside of the first housing, wherein the connector is configured to provide connection and signal transmission;
wherein electrical connections between components of the power circuit are provided by a single-layer pressed screen, receptacles for contact pins of the components of the power circuit are formed in the pressed screen and the receptacles are arranged and configured in such a way that the components of the power circuit are held in frictional engagement in the receptacles via the contact pins and are electrically contacted to one another, wherein the single-layer pressed screen is provided in a second housing including a base plate and a cover, and wherein the single-layer pressed screen is inserted between the base plate and the cover of the second housing and held in position by form locking;
wherein the receptacles for the contact pins are in a form of stamped holes in the pressed screen, wherein each stamped hole has an essentially semicircular basic form, wherein each stamped hole has an edge region with three inwardly directed retaining lips, wherein the first two inwardly directed retaining lips are arranged at one inner edge of the stamped hole, and wherein the third inwardly directed retaining lip is arranged at an oppositely lying inner edge of the stamped hole.

11. The control device as recited in claim 1, further comprising:
a secondary locking slide configured to hold a cable-tree connector in locking position with the connector configured to provide connection and signal transmission.

12. The control device as recited in claim 1, further comprising:
a secondary locking slide configured to hold a cable-tree connector in locking position with a connector pin provided on the second housing.

13. The control device as recited in claim 11, wherein the switching logic is configured to transmit control signals to the components of the power circuit via the pressed screen.

14. A system, comprising:
a power circuit;
an electronic component including a switching logic for the power circuit included on a circuit board, wherein the circuit board is provided in a first housing, the first housing being an electronics housing;
a connector provided on the outside of the first housing, wherein the connector is configured to provide connection and signal transmission;
a cable tree with a cable-tree connector; and
a secondary locking slide configured to hold the cable-tree connector in locking position with the connector configured to provide connection and signal transmission;
wherein electrical connections between components of the power circuit are provided by a single-layer pressed screen, receptacles for contact pins of the components of the power circuit are formed in the pressed screen and the receptacles are arranged and configured so that the components of the power circuit are held in frictional engagement in the receptacles via the contact pins and are electrically contacted to one another, wherein the single-layer pressed screen is provided in a second housing including a base plate and a cover, and wherein the single-layer pressed screen is inserted between the base plate and the cover of the second housing and held in position by form locking;
wherein the receptacles for the contact pins are in a form of stamped holes in the pressed screen, wherein each stamped hole has an essentially semicircular basic form, wherein each stamped hole has an edge region with three inwardly directed retaining lips, wherein the first two inwardly directed retaining lips are arranged at one inner edge of the stamped hole, and wherein the third inwardly directed retaining lip is arranged at an oppositely lying inner edge of the stamped hole.

15. A system, comprising:

a power circuit;

an electronic component including a switching logic for the power circuit included on a circuit board, wherein the circuit board is provided in a first housing, the first housing being an electronics housing;

a connector provided on the outside of the first housing, wherein the connector is configured to provide connection and signal transmission;

a cable tree with a cable-tree connector; and a secondary locking slide;

wherein electrical connections between components of the power circuit are provided by a single-layer pressed screen, receptacles for contact pins of the components of the power circuit are formed in the pressed screen and the receptacles are arranged and configured so that the components of the power circuit are held in frictional engagement in the receptacles via the contact pins and are electrically contacted to one another, wherein the single-layer pressed screen is provided in a second housing including a base plate and a cover, and wherein the single-layer pressed screen is inserted between the base plate and the cover of the second housing and held in position by form locking, and wherein the secondary locking slide is configured to hold the cable-tree connector in locking position with a connector pin provided on the second housing;

wherein the receptacles for the contact pins are in a form of stamped holes in the pressed screen, wherein each stamped hole has an essentially semicircular basic form, wherein each stamped hole has an edge region with three inwardly directed retaining lips, wherein the first two inwardly directed retaining lips are arranged at one inner edge of the stamped hole, and wherein the third inwardly directed retaining lip is arranged at an oppositely lying inner edge of the stamped hole.

16. A control device, comprising:

a power circuit having a plurality of components;

an electronic component including a switching logic for the power circuit included on a circuit board, wherein higher currents are applied to the components of the power circuit than to the electronic component;

wherein electrical connections between components of the power circuit are provided by a single-layer pressed screen, and corresponding receptacles for contact pins of the components of the power circuit are formed in the pressed screen;

wherein the connection between the contact pins of the components and the corresponding receptacles in the pressed screen is configured to be selectively reversible and releasable;

wherein the receptacles are arranged and configured so that the components of the power circuit are held in frictional engagement in the receptacles via the contact pins and are electrically contacted to one another, and the pressed screen is configured as a carrier for the components of the power circuit; and wherein the receptacles for the contact pins are in a form of stamped holes in the pressed screen, and wherein each stamped hole has an edge region with three inwardly directed retaining lips, wherein the first two inwardly directed retaining lips are arranged at one inner edge of the stamped hole, and wherein the third inwardly directed retaining lip is arranged at an oppositely lying inner edge of the stamped hole.

* * * * *